(12) United States Patent
Tamaki et al.

(10) Patent No.: US 7,005,231 B2
(45) Date of Patent: Feb. 28, 2006

(54) POSITIVE TYPE RADIOSENSITIVE COMPOSITION AND METHOD FOR FORMING PATTERN

(75) Inventors: Kentarou Tamaki, Tokyo (JP); Tomohiro Utaka, Tokyo (JP); Akira Nishikawa, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/484,716

(22) PCT Filed: Jul. 19, 2002

(86) PCT No.: PCT/JP02/07343

§ 371 (c)(1),
(2), (4) Date: May 14, 2004

(87) PCT Pub. No.: WO03/010603

PCT Pub. Date: Feb. 6, 2003

(65) Prior Publication Data

US 2004/0197698 A1 Oct. 7, 2004

(30) Foreign Application Priority Data

Jul. 24, 2001 (JP) .............................. 2001-222706
Nov. 16, 2001 (JP) .............................. 2001-352419

(51) Int. Cl.
G03C 1/73 (2006.01)
G03F 7/075 (2006.01)
G03F 7/20 (2006.01)
G03F 7/30 (2006.01)
G03F 7/40 (2006.01)

(52) U.S. Cl. .................. 430/270.1; 430/326; 430/330; 430/331; 430/321

(58) Field of Classification Search ............ 430/270.1, 430/326, 330, 331, 320, 321

See application file for complete search history.

(56) References Cited

U.S. PATENT DOCUMENTS 6,576,393 B1 * 6/2003 Sugita et al. ............ 430/270.1
6,641,963 B1 * 11/2003 Rangarajan et al. .......... 430/30
6,803,169 B1 * 10/2004 Cameron et al. ......... 430/270.1

FOREIGN PATENT DOCUMENTS

| JP | 7-258604 | 10/1995 |
| JP | 9-40779 | 2/1997 |
| JP | 10-310642 | 11/1998 |
| JP | 11-302382 | 11/1999 |
| JP | 2000-056453 | 2/2000 |
| JP | 2000-180643 | 6/2000 |
| JP | 2001-083710 | 3/2001 |

OTHER PUBLICATIONS

Machine-assisted English translation of JP 07-258604 (Yamaho et al) provided by JPO.*
Full, formal English translation of JP 7-258604 (Yamaho et al), provided by PTO.*

* cited by examiner

Primary Examiner—Sin Lee
(74) Attorney, Agent, or Firm—Oblon, Spivak, McClelland, Maier, & Neustadt, P.C.

(57) ABSTRACT

A positive-tone radiation-sensitive composition including: (A) at least one compound selected from the group consisting of a hydrolyzable silane compound represented by general formula $(R^1)_p Si(X)_{4-p}$ (wherein $R^1$ is a non-hydrolyzable organic group having 1 to 12 carbon atoms, X is a hydrolyzable group, and p is an integer from 0 to 3), hydrolyzates thereof and condensates thereof; (B) a photoacid generator; and (C) a basic compound. A cured product that is excellent in terms of pattern precision and so on can be obtained by using the composition. The composition can be used as a material for forming optical waveguides.

11 Claims, 1 Drawing Sheet

F I G. 1

F I G. 2

POSITIVE TYPE RADIOSENSITIVE COMPOSITION AND METHOD FOR FORMING PATTERN

TECHNICAL FIELD

The present invention relates to a positive-tone radiation-sensitive composition and a pattern formation method using the composition. More specifically, the present invention relates to a positive-tone radiation-sensitive composition from which can be obtained a cured product that is excellent in terms of pattern precision and so on, a pattern formation method, and an optical waveguide formation method using the composition.

BACKGROUND ART

As conventional positive-tone photoresist materials that use sol-gel materials, for example in Japanese Patent Application Laid-open No. 10-310642, there are disclosed macromolecular silicone compounds having phenolic hydroxyl groups, and macromolecular silicone compounds in which the hydrogen atoms of the phenolic hydroxyl groups are replaced by specified atoms. Moreover, in Japanese Patent Application Laid-open No. 11-302382 there is disclosed art in which the hydrogen atoms of the carboxyl groups or the hydrogen atoms of the carboxyl groups and the hydroxyl groups of a macromolecular silicone compound are replaced with a group unstable to acids. However, with the art disclosed in the above patent documents, there have been limitations on the type of monomer or polymer that can be used.

Moreover, sol-gel materials are also useful as materials for forming optical waveguides. In this case, because many device materials are of positive-tone, a positive-tone sol-gel material for forming optical waveguides has been desirable.

DISCLOSURE OF THE INVENTION

The present invention was accomplished in view of the above state of affairs. It is an object of the present invention to provide a positive-tone radiation-sensitive composition containing a polysiloxane type compound from which can be obtained a cured product having excellent pattern precision, regardless of the substituents on the silicon atoms.

The above object can be attained by providing a positive-tone radiation-sensitive composition of the present invention that is characterized by containing undermentioned components (A) to (C):

(A) at least one compound selected from the group consisting of hydrolyzable silane compounds represented by undermentioned general formula (1), hydrolyzates thereof and condensates thereof $$(R^1)_p Si(X)_{4-p} \quad (1)$$

(wherein $R^1$ is a non-hydrolyzable organic group having 1 to 12 carbon atoms, X is a hydrolyzable group, and p is an integer from 0 to 3);

(B) a photoacid generator; and (C) a basic compound.

According to the positive-tone radiation-sensitive composition of the present invention, a positive-tone radiation-sensitive cured film can be formed using general-purpose hydrolyzable silane compounds, without using special hydrolyzable silane compound monomers. Moreover, according to the positive-tone radiation-sensitive composition of the present invention, a pattern with excellent resolution can be obtained through patterned exposure.

Moreover, the positive-tone radiation-sensitive composition of the present invention is suitable for forming optical waveguides, and it is possible to reduce waveguide loss in the optical waveguides.

BEST MODE FOR CARRYING OUT THE INVENTION

A positive-tone radiation-sensitive composition of the present invention contains undermentioned components (A) to (C): (A) at least one compound selected from the group consisting of hydrolyzable silane compounds represented by undermentioned general formula (1), hydrolyzates thereof and condensates thereof $$(R^1)_p Si(X)_{4-p} \quad (1)$$

(wherein $R^1$ is a non-hydrolyzable organic group having 1 to 12 carbon atoms, X is a hydrolyzable group, and p is an integer from 0 to 3);

(B) a photoacid generator; and (C) a basic compound.

Following is a description of the components (A) to (C) and other optional components.

[Component (A)]

Out of the constituent components of the positive-tone radiation-sensitive composition, component (A) is a thermosetting component, and comprises at least one compound selected from the group consisting of hydrolyzable silane compounds represented by general formula (1), hydrolyzates thereof and condensates thereof.

(1) Structure

In general formula (1) which represents the component (A) structure, a hydrolyzable group represented by X generally indicates a group that is hydrolyzed to produce a silanol group, or a group that forms a siloxane condensate, upon heating at a temperature in the range of room temperature (25° C.) to 100° C. in the presence of excess water without a catalyst.

Moreover, p in general formula (1) is an integer from 0 to 3, but is more preferably an integer from 0 to 2, particularly preferably 1.

Note, however, that in component (A) represented by general formula (1), some of the hydrolyzable groups represented by X may be hydrolyzed, and in this case component (A) becomes a mixture of hydrolyzable silane compounds and hydrolyzates.

Moreover, a hydrolyzate of a hydrolyzable silane compound includes not only a compound in which alkoxy groups have been converted into silanol groups through a hydrolysis reaction, but also a partial condensate in which some of the silanol groups have condensed with one another, and the other silanol groups have not condensed.

(2) Organic Group $R^1$

'Non-hydrolyzable' for the organic group $R^1$ means a property of remaining stably under the condition that the hydrolyzable group X is hydrolyzed.

Here, examples of the organic group $R^1$ include alkyl groups such as a methyl group, an ethyl group, a propyl group, a butyl group and a hexyl group; aryl groups such as a phenyl group, a xylyl group and a tolyl group, and aralkyl groups such as a benzyl group. The organic group $R^1$ may be straight chain, branched, cyclic, or a combination thereof.

(3) Hydrolyzable Group X

Examples of the hydrolyzable group X in general formula (1) include a hydrogen atom; alkoxy groups having 1 to 12 carbon atoms such as a methoxy group, an ethoxy group, a propoxy group and a butoxy group; halogen atoms such as a chlorine atom, an iodine atom or a fluorine atom; an amino group, and acyloxy groups.

(4) Examples of Hydrolyzable Silane Compounds

Examples of hydrolyzable silane compounds represented by general formula (1) (sometimes referred to merely as 'silane compounds') include silane compounds substituted with four hydrolyzable groups such as tetrachlorosilane, tetraaminosilane, tetraacetoxysilane, tetramethoxysilane, tetraethoxysilane, tetrabutoxysilane, tetraphenoxysilane, tetrabenzyloxysilane, trimethoxysilane and triethoxysilane; silane compounds substituted with three hydrolyzable groups such as methyltrichlorosilane, methyltrimethoxysilane, methyltriethoxysilane, methyltributoxysilane, ethyltrimethoxysilane, ethyltriisopropoxysilane, ethyltributoxysilane, butyltrimethoxysilane, pentafluorophenyltrimethoxysilane, phenyltrimethoxysilane, d3-methyltrimethoxysilane, nonafluorobutylethyltrimethoxysilane and trifluoromethyltrimethoxysilane; silane compounds substituted with two hydrolyzable groups such as dimethyldichlorosilane, dimethyldiaminosilane, dimethyldiacetoxysilane, dimethyldimethoxysilane, diphenyldimethoxysilane and dibutyldimethoxysilane; and silane compounds substituted with one hydrolyzable group such as trimethylchlorosilane, hexamethyldisilazane, trimethylsilane, tributylsilane, trimethylmethoxysilane and tributylethoxysilane.

Moreover, there are no particular limitations on the conditions under which the above silane compound is hydrolyzed or condensed, but as one example, it is preferable to carry out the hydrolysis or condensation through the following three steps 1) to 3).

1) The hydrolyzable silane compound represented by general formula (1) and a prescribed amount of water are put into a vessel equipped with a stirrer.

2) Next, an organic solvent is put into the vessel while adjusting the viscosity of the solution, thus producing a mixed solution.

3) The mixed solution obtained is heated and stirred for 1 to 24 hours in an air atmosphere at a temperature between 0° C. and the boiling point of the organic solvent or the hydrolyzable silane compound. Note that during the heating and stirring, it is preferable to concentrate the mixed solution through distillation or replace the solvent as required.

Moreover, it is preferable to use a catalyst when hydrolyzing or condensing the silane compound. Examples of the type of this catalyst include metal chelate compounds, organic acids, inorganic acids, organic bases, and inorganic bases.

Out of these catalysts, metal chelate compounds, organic acids and inorganic acids are preferable. Titanium chelate compounds, aluminum chelate compounds and organic acids are particularly preferable. One catalyst may be used, or two or more may be used together.

Moreover, the amount used of the catalyst is generally in the range of 0.001 to 10 parts by weight, preferably 0.005 to 10 parts by weight, per 100 parts by weight (in terms of completely hydrolyzed and condensed content) of the silane compound constituting component (A).

Note that in the present invention, 'completely hydrolyzed and condensed content' means that 100% of the hydrolyzable groups in the silane compound represented by general formula (1) have been hydrolyzed into SiOH groups, and have been condensed completely into a siloxane structure.

(5) Weight Average Molecular Weight of Hydrolyzate

It is preferable for the hydrolyzable silane compound constituting component (A) to be in the form of a hydrolyzate in which some or all of the hydrolyzable groups have been hydrolyzed, and in this case, the weight average molecular weight of the hydrolyzate is preferably in the range of 500 to 30,000.

The reasons for this are that if the weight average molecular weight of the hydrolyzate is less than 500, then the film forming ability of the coating film may drop, whereas if the weight average molecular weight of the hydrolyzate exceeds 30,000, then the thermal curing ability may rise, and hence the solubility to the developing solution may drop.

Accordingly, it is more preferable to make the weight average molecular weight of the hydrolyzate be in the range of 800 to 15,000.

Note that the weight average molecular weight of the hydrolyzate can be measured by gel permeation chromatography (hereinafter abbreviated to 'GPC'), and can be calculated in terms of polystyrene as a standard material.

[Component (B)]

Component (B) is a photoacid generator, and is defined as a compound that is able to neutralize the basic compound that constitutes component (C) described later, upon being irradiated with radiation such as ultraviolet radiation.

(1) Type

Examples of the type of the photoacid generator are onium salts having a structure represented by general formula (2) (first group compounds), and sulfonic acid derivatives having a structure represented by general formula (3) (second group compounds).

(In general formula (2), the cation is an onium ion. W is S, Se, Te, P, As, Sb, Bi, O, I, Br, Cl or —N≡N. $R^2$, $R^3$, $R^4$ and $R^5$ are the same organic group or different organic groups. Each of a, b, c and d is an integer from 0 to 3. The sum of a+b+c+d is equal to the valency of W. M is a metal or metalloid constituting the central atom in the halide complex $[MZ_{m+n}]$, for example B, P, As, Sb, Fe, Sn, Bi, Al, Ca, In, Ti, Zn, Sc, V, Cr, Mn or Co. Z is a halogen atom such as F, Cl or Br, or an aryl group. m is the net charge on the halide complex ion. n is the valency of M.)

(In general formula (3), Q is a monovalent or bivalent organic group, $R^6$ is a monovalent organic group having 1 to 12 carbon atoms, s is 0 or 1, and t is 1 or 2.)

First, the onium salts that are the first group compounds are compounds that are able to discharge an acidic active substance upon receiving light.

Here, specific examples of the anion $[MZ_{m+n}]$ in general formula (2) include tetrafluoroborate($BF_4^-$), hexafluorophosphate($PF_6^-$), hexafluoroantimonate($SbF_6^-$), hexafluoroarsenate($AsF_6^-$), hexachloroantimonate($SbCl_6^-$), tetraphenylborate, tetrakis(trifluoromethylphenyl)borate, and tetrakis(pentafluoromethylphenyl)borate.

Moreover, it is also favorable to use an anion represented by the general formula [MZ$_n$OH$^-$] instead of the anion [MZ$_{m+n}$] in general formula (2). Furthermore, an onium salt having another anion such as a perchlorate ion (ClO$_4^-$), a trifluoromethanesulfonate ion (CF$_3$SO$_3^-$), a fluorosulfonate ion (FSO$_3^-$), a toluenesulfonate ion, a trinitrobenzenesulfonate anion, or a trinitrotoluenesulfonate anion can be used.

Moreover, examples of commercially sold ones of the first group compounds include Sun-aid SI-60, SI-80, SI-100, SI-60L, SI-80L, SI-100L, SI-L145, SI-L150, SI-L160, SI-L110 and SI-L147 (all made by Sanshin Chemical Industry Co., Ltd.), UVI-6950, UVI-6970, UVI-6974 and UVI-6990 (all made by Union Carbide Corporation), Adeka Optomer SP-150, SP-151, SP-170 and SP-171 (all made by Asahi Denka Co., Ltd.), Irgacure 261 (made by Ciba Specialty Chemicals), CI-2481, CI-2624, CI-2639 and CI-2064 (all made by Nippon Soda Co., Ltd.), CD-1010, CD-1011 and CD-1012 (all made by Sartomer Company, Inc.), DS-100, DS-101, DAM-101, DAM-102, DAM-105, DAM-201, DSM-301, NAI-100, NAI-101, NAI-105, NAI-106, SI-100, SI-101, SI-105,.SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (all made by Midori Kagaku K.K.), P,I-061T, P,I-062T, P,I-020T and P,I-022T (all made by Nippon Kayaku Co., Ltd.), and IBPF and IB,F (made by Sanwa Chemical Co., Ltd.).

Moreover, out of the first group compounds described above, particularly effective onium salts are aromatic onium salts. Diaryl iodonium salts represented by undermentioned general formula (4) are particularly preferable.

[R$^7$—Ar$^1$—I$^+$—Ar$^2$—R$^8$][Y$^-$]  General formula (4)

(In the formula, each of R$^7$ and R$^8$ is a monovalent organic group, and may be the same or different. At least one of R$^7$ and R$^8$ have an alkyl group having four or more carbon atoms. Each of Ar$^1$ and Ar$^2$ is an aromatic group, and may be the same or different. Y$^-$ is a monovalent anion, and is an anion selected from group III and group V fluoride anions, ClO$_4^-$, and CF$_3$—SO$_3^-$).

Examples of such diaryl iodonium salts include
(4-n-decyloxyphenyl)phenyliodonium hexafluoroantimonate,
[4-(2-hydroxy-n-tetradecyloxy)phenyl]phenyliodonium hexafluoroantimonate,
[4-(2-hydroxy-n-tetradecyloxy)phenyl]phenyliodonium trifluorosulfonate,
[4-(2-hydroxy-n-tetradecyloxy)phenyl]phenyliodonium hexafluorophosphate,
[4-(2-hydroxy-n-tetradecyloxy)phenyl]phenyliodonium tetrakis(pentafluorophenyl)borate,
bis(4-t-butylphenyl)iodonium hexafluoroantimonate,
bis(4-t-butylphenyl)iodonium hexafluorophosphate,
bis(4-t-butylphenyl)iodonium trifluorosulfonate,
bis(4-t-butylphenyl)iodonium tetrafluoroborate,
bis(dodecylphenyl)iodonium hexafluoroantimonate,
bis(dodecylphenyl)iodonium tetrafluoroborate,
bis(dodecylphenyl)iodonium hexafluorophosphate, and
bis(dodecylphenyl)iodonium trifluoromethylsulfonate. It is possible to use one diaryl iodonium salt or a combination of two or more.

Moreover, examples of commercially sold diaryl iodonium salts include, for example, D1012 made by Sartomer Company, Inc., IBPF and IBCF made by Sanwa Chemical Co., Ltd., and BBI-101, BBI-102, BBI-103 and BBI-109 made by Midori Kagaku K.K.

Next, a description will be given of the second group compounds. Examples of the sulfonic acid derivatives represented by general formula (3) include disulfones, disulfonyl diazomethane derivatives, disulfonyl methane derivatives, sulfonyl benzoyl methane derivatives, imidosulfonates, benzoin sulfonates, 1-oxy-2-hydroxy-3-propyl alcohol sulfonates, pyrogallol trisulfonates, and benzyl sulfonates.

Moreover, out of the sulfonic acid derivatives represented by general formula (3), imidosulfonates are particularly preferable. Out of imidosulfonates, trifluoromethylsulfonate derivatives are yet more preferable.

(2) Amount Added

In the present invention, the proportion of the photoacid generator in the positive-tone radiation-sensitive composition is generally 0.01 to 15 parts by weight, preferably 0.05 to 10 parts by weight, per 100 parts by weight (in terms of completely hydrolyzed and condensed content) of component (A).

If the proportion of the photoacid generator is less than 0.01 parts by weight, then the ability to neutralize the basic compound will drop, and hence the rate of thermal curing by component (C) may be dominant. If the proportion of the photoacid generator exceeds 15 parts by weight, then photocuring of component (A) by the generated acid may tend to become dominant.

Moreover, in the present invention, it is also preferable to use a photosensitizer together with the photoacid generator, since energy rays such as light can be absorbed more effectively, and hence the sensitivity of the photoacid generator can be increased.

Examples of such photosensitizers include thioxanthone, diethylthioxanthone, and thioxanthone derivatives; anthraquinone, bromoanthraquinone, and anthraquinone derivatives; anthracene, bromoanthracene, and anthracene derivatives; perylene and perylene derivatives; xanthone, thioxanthone, and thioxanthone derivatives; and coumarin and ketocoumarin.

Moreover, out of these photosensitizers, particularly preferable compounds are diethylthioxanthone and bromoanthracene.

In the case of using such a photosensitizer, the photosensitizer is preferably used in a proportion of 0.1 to 1 wt % relative to the photoacid generator.

[Component (C)]

Component (C), which is a basic compound, is defined as a compound that promotes the curing of component (A) through heat, and is neutralized by the acid generated from component (B).

(1) Type

As the basic compound used as component (C), a nitrogen-containing organic compound for which the basicity does not change upon exposure with radiation during the pattern formation process is preferable.

Examples of such nitrogen-containing organic compounds are compounds represented by undermentioned general formulae (5) and (6) (hereinafter referred to as 'nitrogen-containing compounds (I)').

General formula (5)

General formula (6)

($R^9$, $R^{10}$ and $R^{11}$ in general formula (5) and $R^{12}$, $R^{13}$, $R^{14}$ and $R^{15}$ in general formula (6) are independent each other, and each of these represents a hydrogen atom, an optionally substituted alkyl group having 1 to 15 carbon atoms, or an optionally substituted aryl group. Moreover, Y in general formula (6) represents a quaternary ammonium salt counter anion.)

Moreover, examples of other nitrogen-containing organic compounds include diamino compounds having two nitrogen atoms in one molecule (hereinafter referred to as 'nitrogen-containing compounds (II)'), diamino polymers having three or more nitrogen atoms in one molecule (hereinafter referred to as 'nitrogen-containing compounds (III)'), amide group-containing compounds, urea compounds, and nitrogen-containing heterocyclic compounds.

Here, examples of the nitrogen-containing compounds (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; tetraalkylamine salts such as tetramethylammonium hydroxide, tetraethylammonium hydroxide, and tetrapropylammonium hydroxide; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and alkanolamines such as ethanolamine, diethanolamine, and triethanolamine.

Moreover, examples of the nitrogen-containing compounds (II) include ethylenediamine, N,N,N',N'-tetramethylethylenediamine, tetramethylenediamine, hexaamethylenediamine, N,N,N',N'-tetrakis(2-hydroxyethyl) ethylenediamine, N,N,N',N'-tetrakis(2-hydroxypropyl) ethylenediamine, 4,4'-diaminodiphenylmethane, 4,4'-diaminodiphenylether, 4,4'-diaminobenzophenone, 4,4'-diaminodiphenylamine, 2,2'-bis (4-aminophenyl) propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

Moreover, examples of the nitrogen-containing compounds (III) include polyethyleneimine, polyallylamine, and a polymer of dimethylaminoethylacrylamide.

Moreover, examples of amide group-containing compounds include formamide, N-methylformamide, N,N-dimethylformamide, acetoamide, N-methylacetoamide, N,N-dimethylacetoamide, propionamide, benzamide, pyrrolidone, and N-methylpyrrolidone.

Moreover, examples of urea compounds include urea, methylurea, 1,1-dimethylurea, 1,3-dimethylurea, 1,1,3,3-tetramethylurea, 1,3-diphenylurea, and tributylthiourea.

Moreover, examples of nitrogen-containing heterocyclic compounds include imidazoles such as imidazole, benzimidazole, 2-methylimidazole, 4-methylimidazole, 2-phenylimidazole, 4-phenylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline, and acridine; and pyrazine, pyrazole, pyridazine, quinozaline, purine, pyrrolidine, piperidine, morpholine, 4-methylmorpholine, piperazine, 1,4-dimethylpiperazine, and 1,4-diazabicyclo[2.2.2]octane.

Out of these nitrogen-containing organic compounds, preferable ones include the nitrogen-containing compounds (I) and the nitrogen-containing heterocyclic compounds. Moreover, out of the nitrogen-containing compounds (I), tetraalkylamine salts are particularly preferable. Out of the nitrogen-containing heterocyclic compounds, pyridines are particularly preferable.

One such basic compound can be used alone, although it is also favorable to use two or more mixed together.

Moreover, it is also favorable to use such a nitrogen-containing basic compound together with an acidic compound.

Examples of the acidic compound used in this case include monocarboxylic acids such as formic acid, acetic acid and propionic acid; and dicarboxylic acids such as oxalic acid, malonic acid, succinic acid, adipic acid, maleic acid and succinic acid.

(2) Amount to be Added

The proportion of the basic compound in the positive-tone radiation-sensitive composition of the present invention is generally 0.001 to 15 parts by weight, preferably 0.001 to 10 parts by weight, particularly preferably 0.005 to 5 parts by weight, per 100 parts by weight (in terms of completely hydrolyzed and condensed content) of component (A).

If the proportion of the basic compound is less than 0.001 parts by weight, then depending on the processing conditions, condensation of component (A) may be poor and insufficient for thermal curing. If the proportion of the basic compound exceeds 15 parts by weight, then the thermal curing reaction of component (A) may proceed too much, resulting in the cured product being insoluble in the developing solution.

[Component (D)]

The positive-tone radiation-sensitive composition of the present invention may contain an acrylic polymer as a component (D) in addition to components (A) to (C).

Examples of component (D) include a (meth)acrylic copolymer containing hydrolyzable silyl groups.

By using component (D), the cracking resistance of the positive-tone radiation-sensitive composition can be improved, and moreover the dielectric constant can be made lower than in the case of carrying out the processing with only component (A).

Moreover, when forming the radiation-sensitive composition of the present invention, it is particularly preferable to use a co-condensate obtained by reacting component (A) and component (D) together in advance.

By reacting component (A) and component (D) together in advance in this way, the tendency for phase separation between component (A) and component (D) can be reduced, and hence the transparency and so on of the cured film obtained can be improved.

Following is a description of hydrolyzable silyl group-containing vinyl polymers used as component (D).

[1] Type and Manufacturing Method

A hydrolyzable silyl group-containing vinyl polymer used in a first embodiment is defined as a polymer of a vinyl monomer having at least one hydrolyzable silyl group in the molecule thereof, as represented by general formula (7). The hydrolyzable silyl group in general formula (7) is the same as the hydrolyzable silyl group in general formula (1).

(General formula (7))

[In general formula (7), each $R^{16}$ is independently a hydrogen atom, a halogen atom, or a monovalent organic group having 1 to 12 carbon atoms. $R^{17}$ is a single bond or a bivalent organic group having 1 to 15 carbon atoms. $R^{18}$ and X' represent an alkoxy group, a halogen atom or an acyloxy group. m represents an integer from 0 to 2.]

Moreover, there are no particular limitations on the method of introducing the hydrolyzable silyl groups into the vinyl polymer when manufacturing such a hydrolyzable silyl group-containing vinyl polymer, but it is preferable to adopt, for example, the first manufacturing method or the second manufacturing method described below.

(First Manufacturing Method)

The first manufacturing method is a method in which the hydrolyzable silyl group-containing vinyl polymer is manufactured by polymerizing polymerizable unsaturated monomers having hydrolyzable silyl groups, or by copolymerizing polymerizable unsaturated monomers having hydrolyzable silyl groups and polymerizable unsaturated monomers not having hydrolyzable silyl groups.

Examples of polymerizable unsaturated monomers having a hydrolyzable silyl group used in the first manufacturing method include (meth)acryloxysilanes such as (meth)acryloxypropyltrimethoxysilane, acryloxypropyltrimethoxysilane, (meth)acryloxypropyltriethoxysilane, (meth)acryloxypropylmethyldimethoxysilane, (meth)acryloxypropyltrichlorosilane and bis(methacryloxypropyl)dimethoxysilane; and vinylsilanes such as vinyltrimethoxysilane, vinyltrichlorosilane, vinyltriethoxysilane, divinyldimethoxysilane and divinyldiethoxysilane. Note that one of the above polymerizable unsaturated monomers having hydrolyzable silyl groups may be polymerized alone, or two or more maybe polymerized in combination.

Moreover, polymerizable unsaturated monomers not having a hydrolyzable silyl group are compounds having in the molecule thereof an ethylenic unsaturated bond that will undergo radical polymerization, and are selected from monofunctional monomers having one ethylenic unsaturated bond per molecule.

Examples of such compounds (which is monofunctional monomers) not having a hydrolyzable silyl group include (meth)acrylic acid, (meth)acrylates, acrylamides, N-vinyl compounds, styrenes, vinyl ethers, vinyl esters, halogenated olefins, and dienes.

Examples of preferable (meth)acrylates include alkyl (meth)acrylates, terminal hydroxy group (meth)acrylates, and amino group-containing (meth)acrylates. Specific examples of such (meth)acrylates include methyl (meth)acrylate, ethyl (meth)acrylate, butyl (meth)acrylate, cyclohexyl (meth)acrylate, 7-amino-3,7-dimethyloctyl (meth)acrylate, isobornyloxyethyl (meth)acrylate, isobornyl (meth)acrylate, 2-ethylhexyl (meth)acrylate, ethyldiethyleneglycol (meth)acrylate, dimethylaminoethyl (meth)acrylate, diethylaminoethyl (meth)acrylate, lauryl (meth)acrylate, allyl (meth)acrylate, dicyclopentadiene (meth)acrylate, dicyclopentenyloxyethyl (meth)acrylate, dicyclopentenyl (meth)acrylate, N,N-dimethyl (meth)acrylamide tetrachlorophenyl (meth)acrylate, 2-tetrachlorophenoxyethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydropropyl (meth)acrylate, 4-hydroxybutyl (meth)acrylate, phenoxyethyl (meth)acrylate, butoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate, methyltriethylenediglycol (meth)acrylate, glycidyl (meth)acrylate, and β-(3,4-epoxycyclohexyl)ethyl (meth)acrylate.

Moreover, preferable acrylamides include (meth)acryloyl morpholine, isobutoxymethyl (meth)acrylamide, t-octyl (meth)acrylamide, diacetone (meth)acrylamide, and vinyl caprolactam. Examples of N-vinyl compounds include N-vinylpyrrolidone and N-vinylcarbazole.

Moreover, preferable styrenes include styrene, α-methylstyrene, methylstyrene, methoxystyrene, hydroxystyrene, and chloromethylstyrene. Examples of vinyl ethers include methyl vinyl ether, ethyl vinyl ether, butyl vinyl ether, hydroxyethyl vinyl ether, hydroxybutyl vinyl ether, and nonafluorobutylethyl vinyl ether.

Moreover, preferable vinyl esters include vinyl acetate, vinyl propionate, and vinyl laurate.

Moreover, preferable halogenated olefins include vinylidene fluoride, tetrafluoroethylene, hexafluoropropene, and vinylidene chloride.

Moreover, preferable dienes include butadiene and isoprene.

Note that one of these monofunctional monomers not having a hydrolyzable silyl group may be used alone, or two or more may be used in combination.

Moreover, out of the above-mentioned polymerizable unsaturated monomers not having a hydrolyzable silyl group, it is particularly preferable to use an alkyl (meth)acrylate, since there is no reduction of the thermal curing ability due to nonexistence of an amide structure or amine structure, and also light resistance is good due to nonexistence of an aromatic ring.

Examples of such alkyl (meth)acrylates include methyl (meth)acrylate, ethyl (meth)acrylate, butyl (meth)acrylate, cyclohexyl (meth)acrylate, isobornyl (meth)acrylate, lauryl (meth)acrylate, butoxyethyl (meth)acrylate, polyethylene glycol mono(meth)acrylate, bornyl (meth)acrylate, methyltriethylenediglycol (meth)acrylate, 2-hydroxyethyl (meth)acrylate, 2-hydroxypropyl (meth)acrylate, 4-hydroxybutyl (meth)acrylate, glycidyl (meth)acrylate, and β-(3,4-epoxycyclohexyl)ethyl (meth)acrylate.

Moreover, commercially sold ones of such monofunctional monomers include Aronix M-101, M-102, M-111, M-113, M-117, M-152 and TO-1210 (all made by Toagosei Co., Ltd.), KAYARADT, -110S, R-564 and R-128H (all made by Nippon Kayaku Co., Ltd.), and Viscoat 192, Viscoat 220, Viscoat 2311HP, Viscoat 2000, Viscoat 2100, Viscoat 2150, Viscoat 8F and Viscoat 17F (all made by Osaka Organic Chemical Industry Ltd.).

A publicly known method can be adopted as the method of copolymerizing the vinyl monomers and the polymerizable unsaturated monomers having hydrolyzable silyl groups.

For example, the copolymer may be manufactured by heating and stirring the monomers in an organic solvent or without a solvent, in the presence of a thermal radical polymerization initiator such as an azo compound, a peroxide, or a redox polymerization initiator comprising a combination of an oxidizing agent and a reducing agent.

Here, it is possible to use water instead of an organic solvent, and in this case the manufacture is carried out in the presence of a publicly known surfactant added during emulsion polymerization.

Moreover, there are no particular limitations on the proportions of the polymerizable unsaturated monomers having hydrolyzable silyl groups and the vinyl monomers in the reaction. For example, taking the degree of polymerization of the polymerizable unsaturated monomers having hydrolyzable silyl groups to be t, and taking the degree of polymerization of the vinyl monomers to be u, it is preferable to make $t/(t+u)$ have a value in the range of 0.001 to 1.000. If the value of $t/(t+u)$ is outside such a range, then the light resistance and chemical resistance of the cured product obtained tend to drop. It is more preferable to make $t/(t+u)$ have a value in the range of 0.01 to 0.500.

Furthermore, it is also favorable to use a polymerization initiator that decomposes and initiates polymerization through light instead of a thermal radical polymerization initiator, whereby a copolymer on a par with that obtained using a thermal radical polymerization initiator can be manufactured.

Out of these methods of manufacturing the hydrolyzable silyl group-containing vinyl polymer, a preferable one is a method in which the manufacture is carried out in an organic solvent in the presence of a thermal radical polymerization initiator.

In this case, as the organic solvent, it is preferable to use an organic solvent having a boiling point at one atmosphere in the range of 30° C. to 250° C., more preferably 50° C. to 200° C. Examples of such organic solvents include ethers such as dibutyl ether, tetrahydrofuran, ethylene glycol dimethyl ether, ethylene glycol diethyl ether, and 1,3-dioxane; ketones such as acetone, methyl ethyl ketone, methyl isobutyl ketone, and cyclohexanone; esters such as ethyl acetate, butyl acetate, amyl acetate, and γ-butyrolactone; alcohols such as methanol, ethanol, isopropanol, butanol, and carbitol; aromatic hydrocarbons such as benzene, toluene, and xylene; hydrocarbons such as cyclohexane, n-hexane, and ligroin; amides such as dimethylformamide, dimethylacetamide, and N-methylpyrrolidone; and halogenated hydrocarbons such as carbon tetrachloride and methylene chloride. Out of these, alcohols and ketones are particularly preferable organic solvents.

Moreover, it is preferable for the organic solvent to have a low moisture content to secure stability of the hydrolyzable silyl groups. This moisture content is, for example, preferably not more than 1 wt %, more preferably not more than 0.1 wt %.

Moreover, there are no particular limitations on the polymer solid concentration in the solution so long as the reaction proceeds uniformly and smoothly, but this solid concentration is generally in the range of 10 to 80 wt %, preferably in the range of 20 to 60 wt %.

(Second Manufacturing Method)

The second manufacturing method is a method in which the hydrolyzable silyl group-containing vinyl polymer is manufactured by chemically reacting a vinyl polymer having reactive organic groups with a compound having hydrolyzable silyl groups. In this case, as the compound having hydrolyzable silyl groups, one that has been hydrolyzed in advance, or one that has been hydrolyzed and condensed in advance, can be used.

A publicly known method can be used when introducing the hydrolyzable silyl groups through a chemical reaction, for example:

1) a hydrosilylation reaction in which a trialkoxysilane is added to a polymer having unsaturated double bonds in the presence of a transition metal catalyst;

2) a method in which an alkoxysilane having a mercapto group or an amino group is added to a polymer having epoxy groups;

3) a method in which silylation is carried out through urethane linkages by reacting a polymer having hydroxy groups with an alkoxysilane having an isocyanate group; etc.

As the method of adding the hydrolyzable silyl group-containing vinyl polymer manufactured using the first or second manufacturing method described above, in general the hydrolyzable silyl group-containing vinyl polymer is mixed directly into the hydrolyzable silane compound used as component (A).

Note, however, that it is also favorable to mix component (A) with the hydrolyzable silyl group-containing vinyl polymer in a vessel, and then carry out the hydrolyzable silane hydrolysis and condensation in the same vessel. In the case of carrying out the preparation in this way, a polymer is formed in which component (A) and component (D) are condensed together through siloxane linkages, and hence phase separation does not occur. Manufacture of the positive-tone radiation-sensitive composition thus becomes easier, and the transparency of the cured film obtained is improved.

[2] Amount of Vinyl Polymer to be Added

Next, a description will be given of the amount (i.e. proportion) of the vinyl polymer to be added used in the first embodiment. There are no particular limitations on the amount added of the vinyl polymer, but it is preferable for this amount to be in the range of 1 to 80 parts by weight per 100 parts by weight of component (A). If the amount of the vinyl polymer to be added is less than 1 part by weight, then there will be little change in cracking resistance compared with the case that component (A) is used alone. On the other hand, if the amount of the vinyl polymer to be added exceeds 80 parts by weight, then the thermal resistance of the cured product obtained from the positive-tone radiation-sensitive composition will tend to drop.

From the viewpoint of making the balance between the cracking resistance and the thermal resistance yet better, it is more preferable for the amount of the vinyl polymer to be added to be in the range of 5 to 60 parts by weight, yet more preferably 10 to 40 parts by weight, per 100 parts by weight of component (A).

[3] Weight Average Molecular Weight

There are no particular limitations on the weight average molecular weight of the vinyl polymer, but it is preferable, for example, for this weight average molecular weight to be in the range of 1,000 to 100,000. If the weight average molecular weight of the vinyl polymer is less than 1,000, then the flexibility will tend to drop, whereas if the weight average molecular weight exceeds 1,000,000, then the transparency of the cured film will tend to become poor, and the solubility to the developing solution will tend to drop.

From the viewpoint of making the balance between the flexibility and the transparency yet better, it is more preferable to make the weight average molecular weight of the vinyl polymer be in the range of 3,000 to 50,000, yet more preferably 5,000 to 30,000.

[Organic Solvent]

In the present invention, it is generally preferable to use the components (A) to (C), along with component (D) as required, dissolved in an organic solvent. By using an organic solvent, the storage stability of the positive-tone radiation-sensitive composition can be improved, and a suitable viscosity can be obtained. Accordingly, a coating film having an uniform thickness can be formed.

(1) Type of Organic Solvent

Any type of the organic solvent can be selected, provided the objects and effects of the present invention are not impaired. It is generally preferable to use an organic solvent that has a boiling point at atmospheric pressure in the range of 50 to 200° C., and in which each of the constituent components dissolves uniformly.

Examples of such organic solvents include at least one compound selected from the group consisting of ether type organic solvents, ester type organic solvents, ketone type organic solvents, aromatic hydrocarbon type organic solvents, and alcohol type organic solvents. Out of these, alcohols and ketones are particularly preferable.

The reason for this is that by using such an organic solvent, the storage stability of the positive-tone radiation-sensitive composition can be further improved.

Moreover, examples of a yet particularly preferable organic solvent include at least one compound selected from the group consisting of propylene glycol monomethyl ether, ethyl lactate, methyl isobutyl ketone, methyl amyl ketone, toluene, xylene, and methanol.

(2) Amount of Organic Solvent to be Added

The amount of the organic solvent to be added is preferably in the range of 10 to 99 wt %, where the total amount of the positive-tone radiation-sensitive composition is taken as 100 wt %.

If the amount of the organic solvent to be added is less than 10 wt %, it may be difficult to regulate the viscosity of the positive-tone radiation-sensitive composition. If the amount of the organic solvent to be added exceeds 99 wt %, it may be difficult to form a cured composition having a sufficient thickness.

[Reactive Diluent]

The positive-tone radiation-sensitive composition of the present invention may contain a reactive diluent as required. By including a reactive diluent, cure shrinkage of the coating film can be reduced, and the mechanical strength can be controlled.

Moreover, in the case of using a radical-polymerizable reactive diluent, by further adding a radical generator, the photoreactivity can be regulated, and in the case of using a cationic-polymerizable reactive diluent, the photoreactivity and the mechanical properties can be regulated.

(1) Type of Reactive Diluent

Regarding the type of the reactive diluent, it is preferable to blend in a cationic-polymerizable monomer and an ethylenic unsaturated monomer, or one of these monomers.

Here, a cationic-polymerizable monomer, which is a reactive diluent, is defined as an organic compound that undergoes a polymerization reaction or a crosslinking reaction upon irradiation with light in the presence of a photoacid generator. Examples of the cationic-polymerizable monomer include epoxy compounds, oxetane compounds, oxolane compounds, cyclic acetal compounds, cyclic lactone compounds, thiirane compounds, thietane compounds, vinyl ether compounds, spiroorthoester compounds which are reaction products between an epoxy compound and a lactone, ethylenic unsaturated compounds, cyclic ether compounds, cyclic thioether compounds, and vinyl compounds. One of these cationic-polymerizable monomers may be used alone, or two or more may be used in combination.

There are no particular limitations on ethylenic unsaturated monomers, so long as they are compounds having an ethylenic unsaturated bonds in the molecule thereof. For example, monofunctional monomers having one ethylenic unsaturated bond per molecule, and polyfunctional monomers having two or more ethylenic unsaturated bonds per molecule are favorable.

(2) Amount of Reactive Diluent to be Added

There are no particular limitations on the amount of the reactive diluent, but this amount is generally in the range of 0.1 to 100 parts by weight, preferably 0.5 to 80 parts by weight, more preferably 1 to 50 parts by weight, per 100 parts by weight (in terms of completely hydrolyzed and condensed content) of component (A).

[Inorganic Particles]

The positive-tone radiation-sensitive composition of the present invention may contain inorganic particles as required, whereby the cure shrinkage of the coating film can be reduced, and the mechanical properties and thermal resistance of the cured composition formed can be improved.

(1) Type etc. of Inorganic Particles

Examples of inorganic particles that can be used in the present invention are silica, alkali metal oxides, alkaline earth oxides, and oxides of Ti, Zr, Al, B, Sn, P and so on.

The average particle size of the inorganic particles is preferably in the range of 0.001 to 20 $\mu$m, and in particular, from the standpoint of a transparent cured film formed, is more preferably in the range of 0.001 to 0.2 $\mu$m, and yet more preferably in the range of 0.001 to 0.01 $\mu$m.

Moreover, it is preferable to select the inorganic particles such that the difference between the refractive index of the inorganic particles (temperature 25° C., Na-D line; likewise hereinafter) and the refractive index of the positive-tone radiation-sensitive composition is not more than 0.02 (–). By making the refractive index difference be such a value, the transparency of the cured film can be further improved.

Moreover, the specific surface area of the inorganic particles is preferably in the range of 0.1 to 3,000 $m^2/g$, more preferably 10 to 1,500 $m^2/g$.

Furthermore, there are no particular limitations on the form of the inorganic particles, but this form is preferably at least one form selected from the group consisting of a spherical form, a hollow form, a porous form, a rod-like form, a plate-like form, a fiber-like form, and an irregular form. Note, however, that from the viewpoint of improved dispersibility, it is particularly preferable to use spherical silica particles.

Moreover, it is also favorable to use a dispersion of silica particles as the inorganic particles. Furthermore, it is preferable to use colloidal silica, since then a particularly high transparency can be obtained.

(2) Amount of Inorganic Particles to be Added

There are no particular limitations on the amount of the inorganic particles, but this amount is generally 10 to 250 parts by weight, preferably 20 to 200 parts by weight, particularly preferably 30 to 150 parts by weight, per 100 parts by weight (in terms of completely hydrolyzed and condensed content) of component (A).

As additives other than the constituent components described above, it is favorable to add macromolecular resins other than component (D), for example an epoxy resin, an acrylic resin, a polyamide resin, a polyamide-imide resin, a polyurethane resin, a polybutadiene resin, a polychloroprene resin, a polyether resin, a polyester resin, a styrene-butadiene block copolymer, a petroleum resin, a xylene resin, a ketone resin, a cellulose resin, a fluoropolymer or a silicone polymer, to the positive-tone radiation-sensitive composition of the present invention, provided the objects and effects of the present invention are not impaired.

Moreover, other additives that can be favorably added include polymerization inhibitors, polymerization initiation auxiliaries, leveling agents, wettability improvers, surfactants, plasticizers, ultraviolet absorbers, antioxidants, antistatic agents, and silane coupling agents.

[Pattern Formation Method]

A method of forming a pattern using the positive-tone radiation-sensitive composition of the present invention is to first apply the positive-tone radiation-sensitive composition of the present invention onto a substrate, then semi-cure by heating, then expose with radiation in a pattern, then carry out post-exposure baking to promote a neutralization reaction, and then remove the exposed parts using a developing solution.

A description will now be given citing specific examples.

[1] Preparation of Substrate

First, a substrate having a flat surface is prepared. There are no particular limitations on the type of the substrate, but for example a silicon substrate, a glass substrate or the like can be used.

[2] Formation of Coating Film

The positive-tone radiation-sensitive composition is applied onto the substrate, and dried or heated to form a coating film.

Here, as the method of applying the positive-tone radiation-sensitive composition, a method such as a spin coating method, a dipping method, a spraying method, a bar coating method, a roll coating method, a curtain coating method, a gravure printing method, a silk screen method, or an ink jet method can be used. Out of these, it is particularly preferable to use the spin coating method, since a coating film having a particularly uniform thickness can be obtained.

Moreover, to make the rheological properties of the positive-tone radiation-sensitive composition suitably match the application method, it is preferable to blend in any of various leveling agents, thixotropy-bestowing agents, fillers, organic solvents, surfactants and so on as required.

Moreover, it is preferable to prebake the coating film made from the positive-tone radiation-sensitive composition at a temperature in the range of 50 to 200° C. after the application. Here, a semi-cured state, in which the coating film will dissolve in the developing solution but there is no tackiness, is preferable, and hence the temperature range of 50 to 150° C. is more preferable.

[3] Irradiation

The upper surface of the coating film is irradiated with radiation in a prescribed pattern, for example via a photomask having a line pattern.

The method of irradiating in the prescribed pattern is not limited to a method using a photomask comprising parts through which the radiation can pass and parts through which the radiation cannot pass. Examples of other methods are the following methods a to c.

a. A method using means for electrooptically forming a mask image comprising regions through which the radiation can pass and regions through which the radiation cannot pass in the prescribed pattern, using a similar principle to a liquid crystal display apparatus.

b. A method in which a light-guiding member comprising a bundle of many optical fibers is used, and irradiation is carried out via the optical fibers in the prescribed pattern of the light-guiding member.

c. A method in which laser light, or convergent radiation obtained using a converging optical system such as a lens or a mirror, is irradiated onto the radiation-curable composition while being scanned.

Moreover, there are no particular limitations on the radiation dose, but it is preferable to carry out the exposure by irradiating with radiation of wavelength of 200 to 390 nm and intensity of 1 to 500 mW/cm$^2$ such that the radiation dose is 10 to 5,000 mJ/cm$^2$.

Here, regarding the type of the irradiated radiation, visible light, ultraviolet radiation, infrared radiation, X-rays and so on can be used, but ultraviolet radiation is particularly preferable. Moreover, as the radiation (e.g. ultraviolet radiation) irradiating apparatus, it is preferable to use, for example, a high-pressure mercury lamp, a low-pressure mercury lamp, a metal halide lamp, or an excimer lamp.

Through the irradiation, acid is generated from component (B), and a neutralization reaction with component (C) in the coating film takes place only at the places where the positive-tone radiation-sensitive composition is irradiated.

[4] Heating Treatment

Next, after the exposure, to promote the neutralization reaction at the exposed parts, it is preferable to carry out heating treatment. The heating conditions will vary according to the components' composition of the positive-tone radiation-sensitive composition, the types of additives, and so on, but the temperature is generally in the range of 30 to 200° C., preferably 50 to 150° C.

[5] Developing

The coating film that has been selectively cured by exposing with radiation in a prescribed pattern as described above can be developed utilizing the difference in solubility between the cured parts and the uncured parts. After the patterned exposure, it is thus possible to remove the uncured parts while leaving behind the cured parts, resulting in formation of a positive-tone pattern.

Here, as the developing solution, it is possible to use, for example, an organic solvent, or an alkaline aqueous solution containing an alkali such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, N-methylpyrrolidone, dimethylethanolamine, triethanolamine, tetramethylammonium hydroxide, tetraethylammonium hydroxide, choline, pyrrole, piperidine, 1,8-diazabicyclo[5.4.0]-7-undecene, or 1,5-diazabicyclo[4.3.0]-5-nonane.

Moreover, in the case of using an alkaline aqueous solution, it is preferable that the concentration thereof is generally in the range of 0.05 to 25 wt %, preferably in the range of 0.1 to 3.0 wt %.

Furthermore, it is also favorable to add a suitable amount of a water-soluble organic solvent such as methanol or ethanol, a surfactant or the like to such an alkaline aqueous solution, and use the mixture obtained as the developing solution.

Moreover, the developing time is generally 30 to 600 seconds, and as the developing method, a publicly known method such as a liquid mounting method, a dipping method, or a showering developing method can be used.

In the case of using an organic solvent as the developing solution, a patterned coating film can be formed by air drying, whereby moisture is removed from the surface. In the case of using an alkaline aqueous solution, a patterned coating film can be formed by washing in running water, for example 30 to 90 seconds, and subsequent air drying using compressed air, compressed nitrogen or the like, whereby moisture is removed from the surface.

[6] Heating Treatment After Developing

Next, to further cure the patterned parts, heating treatment is carried out, for example, at a temperature of 30 to 400° C. for 5 to 60 minutes using a heating apparatus such as a hotplate or an oven, whereby a cured coating film is formed.

In this way, varnish that constitutes the positive-tone radiation-sensitive composition is condensed in a promoted way by the basic compound, and through the acid generated through the patterned exposure by irradiation, neutralization occurs only at the irradiated parts, whereby a positive-tone cured product having excellent pattern precision can be obtained.

The positive-tone radiation-sensitive composition of the present invention can be effectively used for optical waveguides, insulating films, protective films, and so on.

[Optical Waveguide Formation Method]

A method of forming an optical waveguide using the positive-tone radiation-sensitive composition (i.e. composition for optical waveguide formation) of the present invention is constituted primarily from a lower clad layer formation step, a core portion formation step, and an upper clad layer formation step.

Note that in the following description, the composition for optical waveguide formation is used for each of the lower clad layer, the core portion and the upper clad layer, but it is also possible, for example, to use the composition for optical waveguide formation only for the core portion. In this case, it is preferable to use a publicly known optical waveguide material such as quartz glass for the lower clad layer and the upper clad layer.

Moreover, to make the rheological properties of the composition for optical waveguide formation suitable for the actual application means, it is preferable to blend in any of various leveling agents, thixotropy-bestowing agents, fillers, organic solvents, surfactants and so on as required.

The core portion, the lower clad layer and the upper clad layer can be formed through a similar procedure to the pattern formation method described above.

[Structure of Optical Waveguide]

An example of the constitution of an optical waveguide of the present invention will now be described with reference to the drawings.

Figure 1:
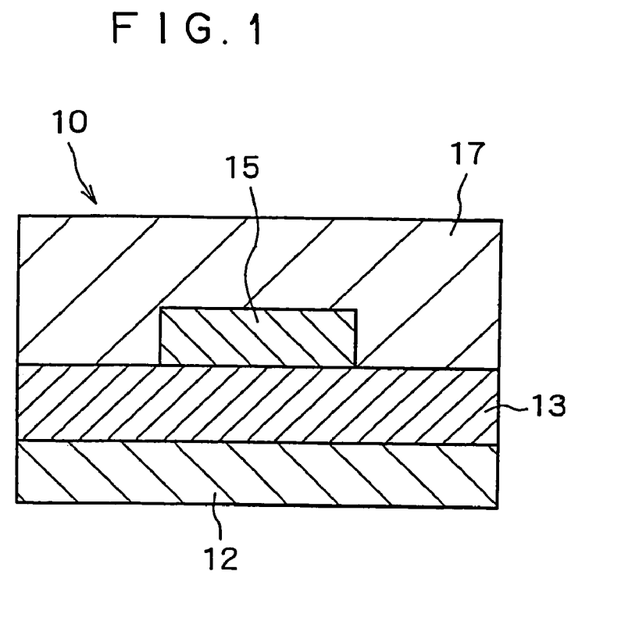
FIG. 1 is a sectional view of an example of the optical waveguide of the present invention.

First, the optical waveguide 10 shown in FIG. 1 is formed from a substrate 12 that extends in a direction perpendicular to the plane of the paper (i.e. the light waveguiding direction), and a lower clad layer 13, a core portion 15 and an upper clad layer 17, which are formed in this order on the substrate 12.

Regarding the core portion 15, for the purpose of not leaking out the waveguided light from the sides, a constitution is adopted in which the width of the core portion 15 in the transverse sectional direction relative to the light waveguiding direction is made to be narrower than the corresponding width of the upper clad layer 17 and the lower clad layer 13, and the upper clad layer 17 goes around the sides of the core portion 15. That is, the constitution is such that the whole of the core portion 15 is embedded in the body comprising the lower clad layer 13 and the upper clad layer 17 stacked up on one another.

Note that in the example shown in FIG. 1, only one core portion 15 is provided, but a plurality of core portion 15 may be provided parallel to one another.

Figure 2:
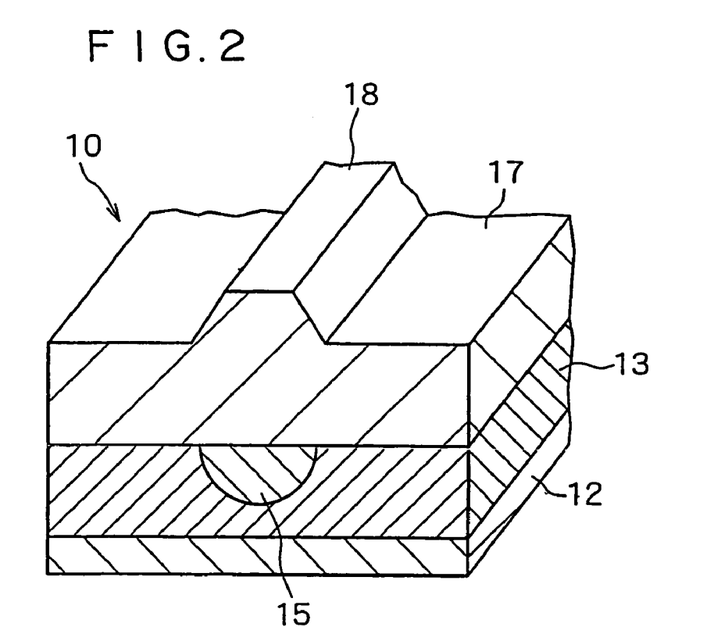
FIG. 2 is a perspective view of another example of the optical waveguide of the present invention.

Moreover, in the example of the optical waveguide shown in FIG. 1, the constitution is such that the upper clad layer 17 goes around the sides of the core portion 15, but as shown in FIG. 2, a constitution may be adopted in which the core portion 15 has a semicircular cylinder shape, and the lower clad layer 13 goes around the periphery of the core portion 15. Furthermore, although not shown in the drawings, an optical waveguide constitution, in which the upper clad layer is made to go around only one side of the core portion, and the lower clad layer is made to go around the other side of the core portion, may be adopted.

Moreover, to carry out light waveguiding more efficiently, as shown in FIG. 2, it is also favorable to integrally provide a ridge part 18 above the core portion 15. There are no particular limitations on the form of the ridge part 18, but for example it is favorable to make the cross-sectional shape be a trapezoid.

In the optical waveguide 10 having a constitution as described above, there are no particular limitations on the thicknesses of the lower clad layer 13, the upper clad layer 17 and the core portion 15, but for example it is preferable to make the thickness of the lower clad layer 13 be in the range of 3 to 50 $\mu$m, the thickness of the core portion 15 be in the range of 3 to 20 $\mu$m, and the thickness of the upper clad layer 17 be in the range up to 50 $\mu$m.

Moreover, there are no particular limitations on the width of the core portion 15 in the transverse sectional direction relative to the light waveguiding direction, but it is preferable to make this width, for example, be in the range of 1 to 50 $\mu$m.

Moreover, with the optical waveguide 10, it is necessary to make the refractive index of the core portion 15 be greater than the refractive indexes of the lower clad layer 13 and the upper clad layer 17. To obtain excellent waveguiding properties, it is preferable to make the refractive index of the core portion 15 be in the range of 1.450 to 1.650, and the refractive index of the lower clad layer 13 and the upper clad layer 17 be in the range of 1.400 to 1.648, for light of wavelength of 1300 to 1600 nm.

Moreover, it is preferable to set the refractive index of the core portion 15 considering the values of the refractive index of the lower clad layer 13 and the upper clad layer 17. It is particularly preferable to make the refractive index of the core portion 15 be a value greater than the value of the refractive index of the lower clad layer 13 and the upper clad layer 17 by 0.002 to 0.5.

Note that the waveguide of the present invention has the distinctive feature that the refractive index value can easily be changed by suitably changing the type of the hydrolyzable silane compounds in the composition for optical waveguide formation, or by adding a hydrolyzable titanium compound, or doping with a rare earth element.

EXAMPLES

Following is a description of Examples of the present invention. The present invention is not limited to these Examples. Moreover, in the Examples, the contents of the various components are expressed as parts by weight unless otherwise stated.

[Preparation of Radiation-Sensitive Compositions]

(1) Polysiloxane Solution 1

Methyltrimethoxysilane (304.42 g, 2.23 mol) and phenyltrimethoxysilane (230.33 g, 1.16 mol), propylene glycol monomethyl ether (150 g), and an Al catalyst (0.2 g, 0.005 wt %) were put into a vessel equipped with a stirrer, and the vessel was immersed in an oil bath at 60° C., and stirring was carried out for 15 minutes. Once the temperature inside the vessel had reached 60° C., a prescribed amount of ion exchange water having an electrical conductivity of $8\times10^{-5}$ $S \cdot cm^{-1}$ (244.15 g, 13.56 mol) was added. Stirring was then carried out for 5 hours, thus hydrolyzing the methyltrimethoxysilane and the phenyltrimethoxysilane. Next, acetylacetone (30 g, 0.30 mol) was added, and then the methanol produced through the hydrolysis was removed using an evaporator. Ultimately, a propylene glycol monomethyl ether solution containing a polysiloxane with the solid content made to be 65 wt % was obtained. This shall be referred to as 'polysiloxane solution 1'.

(2) Polysiloxane Solution 2

Methyl methacrylate (375 g, 3.74 mol), 2-hydroxypropyl acrylate (75 g, 0.64 mol), methacryloxypropyltrimethoxysilane (50 g, 0.20 mol) propylene glycol monomethyl ether (1250 g), and 2,2'-azobis-(2,4-dimethylvaleronitrile) (35 g, 0.14 mol) were put into a vessel equipped with a stirrer, and the system was purged with nitrogen. The temperature inside the reaction vessel was then set at 70° C., and stirring was carried out for 6 hours. Ultimately, a propylene glycol monomethyl ether solution containing an acrylic polymer with the solid content made to be 28 wt % was obtained. This shall be referred to as 'acrylic polymer solution 1'.

Acrylic polymer solution 1 (133.93 g), methyltrimethoxysilane (85.62 g, 0.62 mol), dimethyldimethoxysilane (45.60 g, 0.38 mol), phenyltrimethoxysilane (64.78 g, 0.33 mol), propylene glycol monomethyl ether (11.27 g), and an Al catalyst (0.1 g, 0.005 wt %) were put into a vessel equipped with a stirrer, and the vessel was immersed in an oil bath at 60° C., and stirring was carried out for 15 minutes. Once the temperature inside the vessel had reached 60° C., a prescribed amount of ion exchange water having an electrical conductivity of $8\times10^{-5}$ $S \cdot cm^{-1}$ (81.67 g, 4.52 mol) was added. Stirring was then carried out for 5 hours, thus hydrolyzing the methyltrimethoxysilane and the phenyltrimethoxysilane. Next, acetylacetone (15 g, 0.15 mol) was added, and then the methanol produced through the hydrolysis was removed using an evaporator. Ultimately, a propylene glycol monomethyl ether solution containing a polysiloxane with the solid content made to be 65 wt % was obtained. This shall be referred to as 'polysiloxane solution 2'.

(3) Polysiloxane Solution 3

Phenyltrimethoxysilane (414.59 g, 2.09 mol) and tetraethoxysilane (103.99 g, 0.50 mol), propylene glycol monomethyl ether (225 g), and an Al catalyst (0.2 g, 0.005 wt %) were put into a vessel equipped with a stirrer, and the vessel was immersed in an oil bath at 60° C., and stirring was carried out for 15 minutes. Once the temperature inside the vessel had reached 60° C., a prescribed amount of ion exchange water having an electrical conductivity of $8\times10^{-5}$ $S \cdot cm^{-1}$ (186.36 g, 10.36 mol) was added. Stirring was then carried out for 5 hours, thus hydrolyzing the methyltrimethoxysilane and the phenyltrimethoxysilane. Next, acetylacetone (30 g, 0.30 mol) was added, and then the methanol produced through the hydrolysis was removed using an evaporator. Ultimately, a propylene glycol monomethyl ether solution containing a polysiloxane with the solid content made to be 65 wt % was obtained. This shall be referred to as 'polysiloxane solution 3'.

(4) Polysiloxane Solution 4

Styrene monomer (525 g, 5.04 mol), 2-hydroxyethyl acrylate (150 g, 1.30 mol), methacryloxypropyltrimethoxysilane (75 g, 0.30 mol), propylene glycol monomethyl ether (750 g), and 2,2'-azobis-(2-methylpropionitrile) (22.5 g, 0.13 mol) were put into a vessel equipped with a stirrer, and the system was purged with nitrogen. The temperature inside the reaction vessel was then set at 80° C., and stirring was carried out for 6 hours. Ultimately, a propylene glycol monomethyl ether solution containing an acrylic polymer with the solid content made to be 48 wt % was obtained. This shall be referred to as 'acrylic polymer solution 2'.

Acrylic polymer solution 2 (375 g), methyltrimethoxysilane (80.98 g, 0.59 mol), phenyltrimethoxysilane (123.00 g, 0.62 mol), propylene glycol monomethyl ether (105.00 g), and an Al catalyst (0.07 g, 0.005 wt %) were put into a vessel equipped with a stirrer, and the vessel was immersed in an oil bath at 60° C., and stirring was carried out for 15 minutes. Once the temperature inside the vessel had reached 60° C., a prescribed amount of ion exchange water having an electrical conductivity of $8\times10^{-5}$ $S \cdot cm^{-1}$ (81.67 g, 4.52 mol) was added. Stirring was then carried out for 5 hours, thus hydrolyzing the methyltrimethoxysilane and the phenyltrimethoxysilane. Next, acetylacetone (15 g, 0.15 mol) was added, and then the methanol produced through the hydrolysis was removed using an evaporator. Ultimately, a propylene glycol monomethyl ether solution containing a polysiloxane with the solid content made to be 65 wt % was obtained. This shall be referred to as 'polysiloxane solution 4'.

[Preparation of Compositions for Optical Waveguide Formation]

(1) Preparation of Positive-Tone Radiation-Sensitive Composition A (Used as Core Material) for Optical Waveguide Formation 0.1 parts by weight of a photoacid generator ((4,7-dibutoxy-1-naphthylene)dimethylsulfone trifluoromethanesulfonate), 0.025 parts by weight of a basic compound (i.e. a compound made from tetramethylammonium hydroxide and acetic acid), and 0.05 parts by weight of SH28PA (made by Dow Corning Toray Silicone Co., Ltd.) as a silicone surfactant were added to 100 parts by weight (in terms of solid content) of polysiloxane solution 1, and mixing to homogeneity was carried out, thus obtaining a positive-tone radiation-sensitive composition A.

(2) Preparation of Positive-Tone Radiation-Sensitive Composition B (Used as Clad Material) for Optical Waveguide Formation 0.1 parts by weight of a photoacid generator ((4,7-dibutoxy-1-naphthylene)dimethylsulfone trifluoromethanesulfonate), 0.025 parts by weight of a basic compound (i.e. a compound made from tetramethylammonium hydroxide and acetic acid), and 0.05 parts by weight of SH28PA (made by Dow Corning Toray Silicone Co., Ltd.) as a silicone surfactant were added to 100 parts by weight (in terms of solid content) of polysiloxane solution 2, and mixing to homogeneity was carried out, thus obtaining a positive-tone radiation-sensitive composition B.

(3) Preparation of Positive-Tone Radiation-Sensitive Composition C (Used as Core Material) for Optical Waveguide Formation 0.1 parts by weight of a photoacid generator ((4,7-dibutoxy-1-naphthylene)dimethylsulfone trifluoromethanesulfonate), 0.025 parts by weight of a basic compound (i.e. a compound made from tetramethylammonium hydroxide and acetic acid), and 0.05 parts by weight of SH28PA (made by Dow Corning Toray Silicone Co., Ltd.) as a silicone surfactant were added to 100 parts by weight (in terms of solid content) of polysiloxane solution 3, and mixing to homogeneity was carried out, thus obtaining a positive-tone radiation-sensitive composition C.

(4) Preparation of Positive-Tone Radiation-Sensitive Composition D (Used as Clad Material) for Optical Waveguide Formation 0.1 parts by weight of a photoacid generator ((4,7-dibutoxy-1-naphthylene)dimethylsulfone trifluoromethanesulfonate), 0.025 parts by weight of a basic compound (i.e. a compound made from tetramethylammonium hydroxide and acetic acid), and 0.05 parts by weight of SH28PA (made by Dow Corning Toray Silicone Co., Ltd.) as a silicone surfactant were added to 100 parts by weight (in terms of solid content) of polysiloxane solution 4, and mixing to homogeneity was carried out, thus obtaining a positive-tone radiation-sensitive composition D.

Example 1

Composition B for optical waveguide formation was applied onto the surface of a silicon substrate using a spin coater, drying was carried out for 10 minutes at 80° C., and then heating was carried out for 1 hour at 200° C., thus forming a lower clad layer having a thickness of 10 $\mu$m. The refractive index of this lower clad layer to light of wavelength 1550 nm was 1.4628.

Next, composition A for optical waveguide formation was applied onto the lower clad layer using a spin coater, drying was carried out for 3 minutes at 80° C., and then using a photomask having an optical waveguide pattern of width of 4 to 20 $\mu$m, exposure was carried out by irradiating with ultraviolet radiation of wavelength of 365 nm and intensity of 200 mW/cm$^2$ for 5 seconds. Next, the irradiated coating film was heated for 2 minutes at 100° C. After that, the substrate was immersed in a developing solution comprising a 1.8 wt % tetramethylammonium hydroxide (TMAH) aqueous solution, thus dissolving the exposed parts. After that, heating was carried out for 1 hour at 200° C., thus forming a core portion having a thickness of 7 $\mu$m. The refractive index of the obtained core portion to light of wavelength 1550 nm was 1.4685.

Composition B for optical waveguide formation was further applied onto the upper surface of the lower clad layer having the core portion thereon using a spin coater, drying was carried out for 10 minutes at 80° C., and then heating was carried out for 1 hour at 200° C., thus forming an upper clad layer having a thickness of 15 $\mu$m, whereby an optical waveguide was formed. The refractive index of the formed upper clad layer to light of wavelength 1550 nm was 1.4628.

For the optical waveguide obtained in this way, light of wavelength 1300 nm and 1550 nm was inputted into one end of the waveguide, and the quantity of light emerging from the other end was measured using a power meter. The result was that the waveguide loss for the optical waveguide was less than 0.3 and 0.7 dB/cm respectively for the two cases.

Example 2

Composition D for optical waveguide formation was applied onto the surface of a silicon substrate using a spin coater, drying was carried out for 10 minutes at 80° C., and then heating was carried out for 1 hour at 200° C., thus forming a lower clad layer having a thickness of 10 $\mu$m. The refractive index of this lower clad layer to light of wavelength 1550 nm was 1.5236.

Next, composition C for optical waveguide formation was applied onto the lower clad layer using a spin coater, drying was carried out for 1 minute at 80° C., and then using a photomask having an optical waveguide pattern of width of 4 to 20 $\mu$m, exposure was carried out by irradiating with ultraviolet radiation of wavelength of 365 nm and intensity of 200 mW/cm$^2$ for 5 seconds. Next, the irradiated coating film was heated for 2 minutes at 100° C. After that, the substrate was immersed in a developing solution comprising a 1.8 wt % tetramethylammonium hydroxide (TMAH) aqueous solution, thus dissolving the exposed parts. After that, heating was carried out for 1 hour at 200° C., thus forming a core portion having a thickness of 7 $\mu$m. The refractive index of the obtained core portion to light of wavelength 1550 nm was 1.5285.

Composition D for optical waveguide formation was further applied onto the upper surface of the lower clad layer having the core portion thereon using a spin coater, drying was carried out for 10 minutes at 80° C., and then heating was carried out for 1 hour at 200° C., thus forming an upper clad layer having a thickness of 15 $\mu$m, whereby an optical waveguide was formed. The refractive index of the formed upper clad layer to light of wavelength 1550 nm was 1.5236.

For the optical waveguide obtained in this way, light of wavelength 1300 nm and 1550 nm was inputted into one end of the waveguide, and the quantity of light emerging from the other end was measured using a power meter. The result was that the waveguide loss for the optical waveguide was less than 0.3 and 0.4 dB/cm respectively for the two cases.

The invention claimed is:

1. A positive-tone radiation-sensitive composition, comprising:
(A) at least one compound selected from the group consisting of a hydrolyzable silane compound represented by general formula (1), hydrolyzates thereof and condensates thereof $$(R^1)_p Si(X)_{4-p} \quad (1)$$

(wherein $R^1$ is a non-hydrolyzable organic group having 1 to 12 carbon atoms, X is a hydrolyzable group, and p is an integer from 0 to 3);
(B) a photoacid generator; and (C) a basic compound that is present in effective amounts to promote the curing of component (A) through heat, and is neutralized by the acid generated from component (B).

2. The positive-tone radiation-sensitive composition according to claim 1, further comprising an acrylic polymer as a component (D).

3. A positive-tone radiation-sensitive composition according to claim 2, wherein said components (A) and (D) are included in the form of a co-condensate obtained by reacting said component (A) and said component (D) together in advance.

4. The positive-tone radiation-sensitive composition according to claim 1, further comprising an organic solvent.

5. A positive-tone radiation-sensitive composition according to claim 1, wherein the amount of component (B) is 0.01 to 15 parts by weight, and the amount of component (C) is 0.001 to 15 parts by weight, per 100 parts by weight (in terms of completely hydrolyzed and condensed content) of component (A).

6. A pattern formation method comprising: a step of applying a positive-tone radiation-sensitive composition, which comprises (A) at least one compound selected from the group consisting of a hydrolyzable silane compound represented by general formula (1), hydrolyzates thereof and condensates thereof $$(R^1)_p Si(X)_{4-p} \qquad (1)$$

(wherein $R^1$ is a non-hydrolyzable organic group having 1 to 12 carbon atoms, X is a hydrolyzable group, and p is an integer from 0 to 3), (B) a photoacid generator, (C) a basic compound, onto a substrate to form a coating film; a step of irradiating desired places of the coating film with radiation; and a step of removing the irradiated parts of the coating film.

7. The pattern formation method according to claim 6, further comprising a step of heating the coating film before the irradiation, and a step of heating the coating film after the irradiation.

8. The pattern formation method according to claim 6, further comprising a step of heating the coating film between the step of irradiating desired places of the coating film with radiation and the step of removing the irradiated parts of the coating film, and wherein the step of removing the irradiated parts of the coating film is carried out by developing the coating film with a developing solution.

9. A method of forming an optical waveguide, comprising: a step of applying a positive-tone radiation-sensitive composition for optical waveguides, which comprises (A) at least one compound selected from the group consisting of a hydrolyzable silane compound represented by general formula (1), hydrolyzates thereof and condensates thereof $$(R^1)_p Si(X)_{4-p} \qquad (1)$$

(wherein $R^1$ is a non-hydrolyzable organic group having 1 to 12 carbon atoms, X is a hydrolyzable group, and p is an integer from 0 to 3), (B) a photoacid generator, and (C) a basic compound, onto a substrate to form a coating film; a step of irradiating desired places of the coating film with radiation; and a step of removing the irradiated parts of the coating film.

10. An optical waveguide which has been formed using the method according to claim 9.

11. An optical waveguide produced from a positive-tone radiation-sensitive composition which comprises:
(A) at least one compound selected from the group consisting of a hydrolyzable silane compound represented by general formula (1), hydrolyzates thereof and condensates thereof $$(R^1)_p Si(X)_{4-p} \qquad (1)$$

(wherein $R^1$ is a non-hydrolyzable organic group having 1 to 12 carbon atoms, X is a hydrolyzable group, and p is an integer from 0 to 3);
(B) a photoacid generator; and
(C) a basic compound.

* * * * *